US008339788B2

United States Patent
Lin

(10) Patent No.: US 8,339,788 B2
(45) Date of Patent: Dec. 25, 2012

(54) PRINTED CIRCUIT BOARD WITH HEAT SINK

(75) Inventor: Tai-Wei Lin, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 224 days.

(21) Appl. No.: 12/944,770

(22) Filed: Nov. 12, 2010

(65) Prior Publication Data

US 2012/0120606 A1   May 17, 2012

(30) Foreign Application Priority Data

Nov. 11, 2010   (TW) ............................... 99138772 A

(51) Int. Cl.
*H05K 7/20* (2006.01)
(52) U.S. Cl. .............. 361/704; 361/679.46; 361/679.54; 361/719; 165/80.3; 165/185
(58) Field of Classification Search ............. 361/679.46, 361/679.54, 704–712, 175, 719, 720–724; 165/80.2, 80.3, 104.33, 104.34, 185; 257/706–727; 174/15.1, 16.3, 252; 29/890.03, 890.02, 29/832, 592.1; 24/453, 457, 458, 625, 588, 24/981; 248/505, 506, 510; 411/511, 516, 411/520, 522, 530
See application file for complete search history.

(56) References Cited

U.S. PATENT DOCUMENTS

| | | | | |
|---|---|---|---|---|
| 5,640,305 A * | 6/1997 | Smithers | ....................... | 361/719 |
| 5,699,229 A * | 12/1997 | Brownell | ....................... | 361/719 |
| 5,881,800 A * | 3/1999 | Chung | ....................... | 165/80.3 |
| 6,246,584 B1* | 6/2001 | Lee et al. | ....................... | 361/704 |
| 6,518,507 B1* | 2/2003 | Chen | ....................... | 174/252 |
| 7,055,589 B2* | 6/2006 | Lee et al. | ....................... | 165/185 |
| 7,203,066 B2* | 4/2007 | Lee et al. | ....................... | 361/704 |
| 7,983,048 B2* | 7/2011 | Sasaki et al. | ....................... | 361/719 |
| 8,201,617 B2* | 6/2012 | Ye et al. | ....................... | 165/80.3 |
| 2005/0094377 A1* | 5/2005 | Lee et al. | ....................... | 361/704 |
| 2008/0253093 A1* | 10/2008 | Bailey | ....................... | 361/719 |

* cited by examiner

*Primary Examiner* — Michail V Datskovskiy
(74) *Attorney, Agent, or Firm* — Altis Law Group, Inc.

(57) ABSTRACT

A printed circuit board includes a heat sink and a circuit board. The heat sink defines two fixing blind holes respectively arranged on adjacent opposite ends of the heat sink. The circuit board includes a heat-generating component and two fixing elements corresponding to the fixing blind holes. Each fixing elements includes a fixing portion fixed on the circuit board, a locking portion, and an elastic portion extending from a first end of the locking portion to be connected to the fixing portion. A second end of the locking portion of each fixing element is inserted into a corresponding fixing blind hole, to fix the heat sink on the heat-generating component.

5 Claims, 3 Drawing Sheets

PRINTED CIRCUIT BOARD WITH HEAT SINK

BACKGROUND

1. Technical Field

The present disclosure relates to a printed circuit board including a heat sink.

2. Description of Related Art

Finned heat sinks have been found to be particularly effective for transferring heat through conduction from a heat-generating component such as a semiconductor chip and rapidly dissipating such heat into the environment. For fixing the heat sink on the heat-generating component, a common method is to use a rotating element to fix the heat sink. However, the rotating element needs to extend through a channel between two adjacent fins of the heat sink, which may influence heat dissipation effect.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
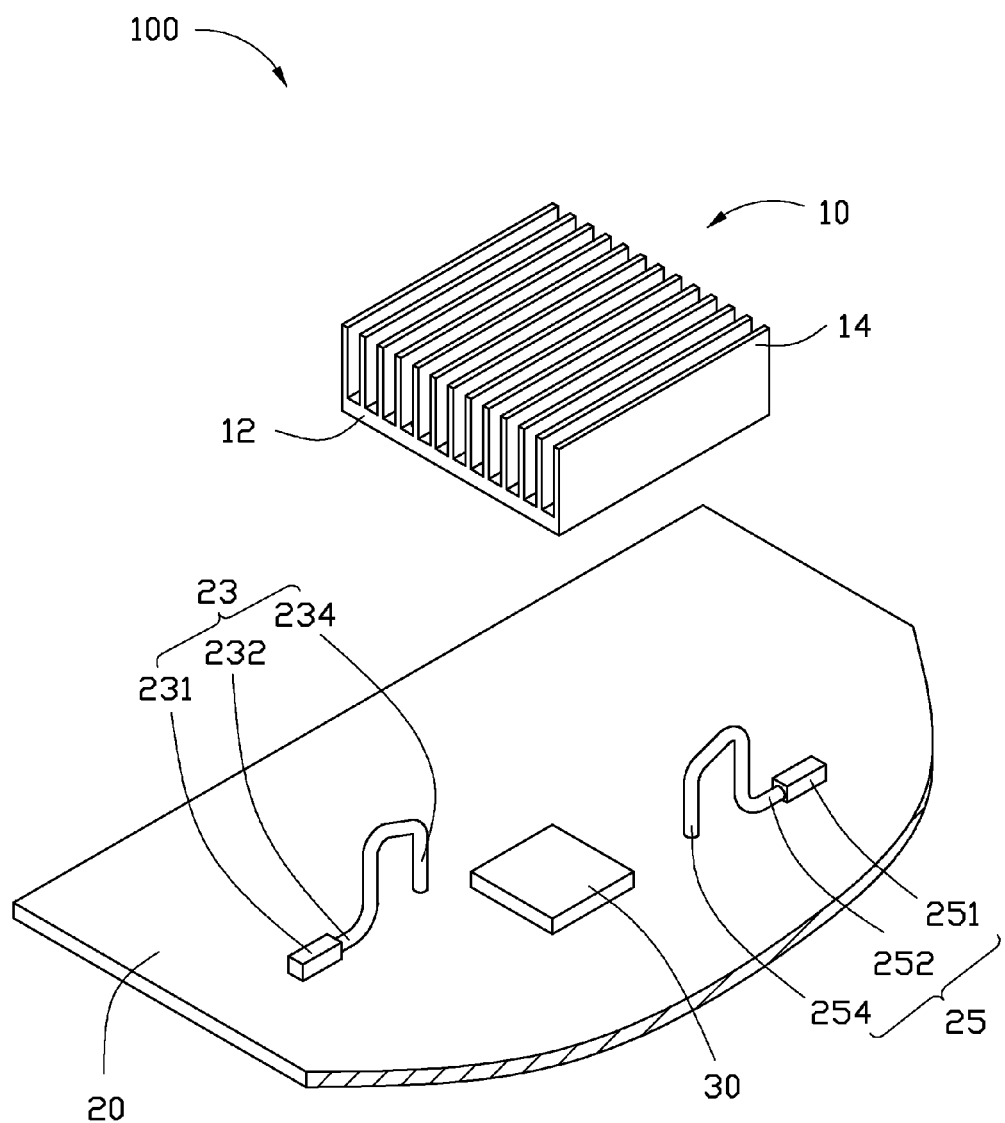
FIG. 1 is an exploded, isometric view of an embodiment of a printed circuit board including a heat sink.
Figure 2:
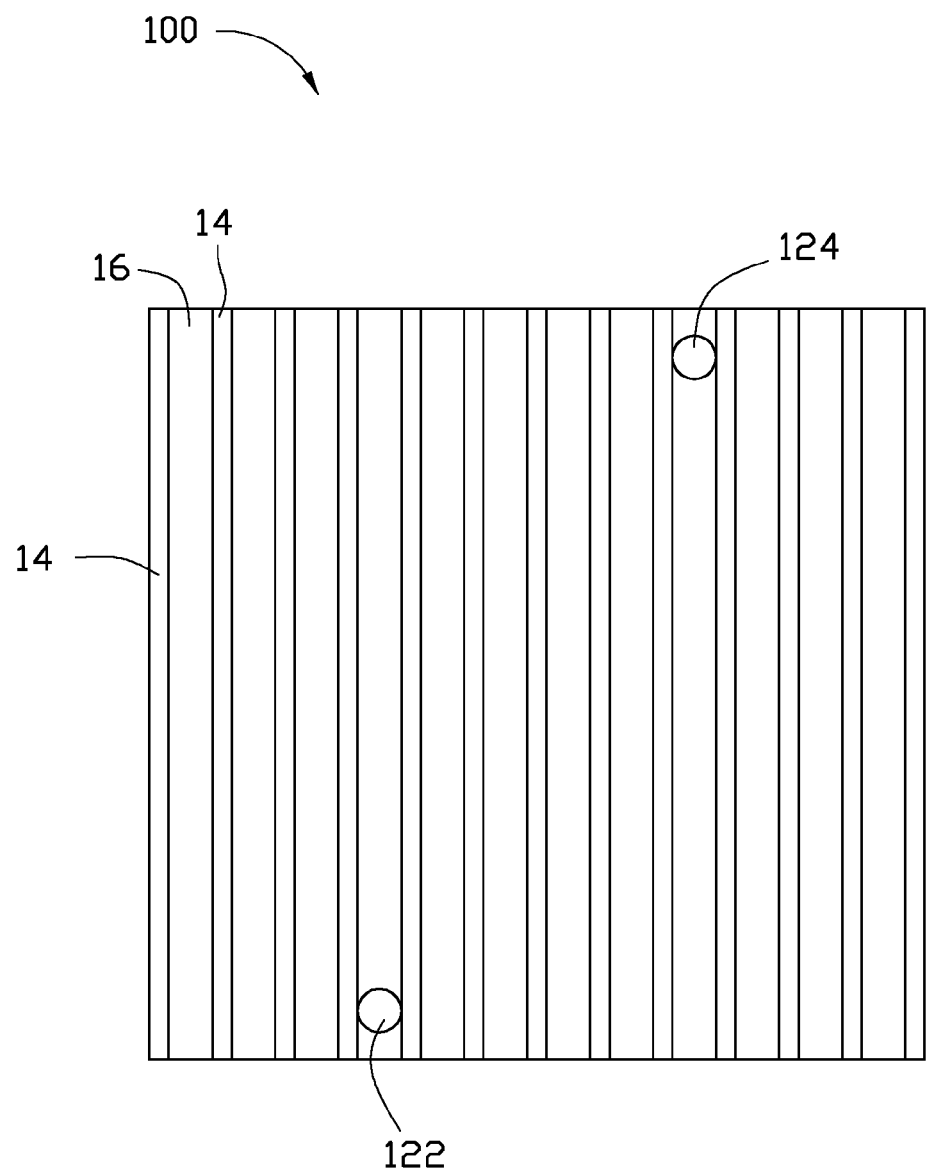
FIG. 2 is top plan view of the heat sink of FIG. 1.

Referring to FIGS. 1 and 2, an embodiment of a printed circuit board 100 includes a circuit board 20 and a heat sink 10.

The heat sink 10 includes a rectangular thermal-conductive base 12 and a number of thermal-conductive fins 14 protruding substantially perpendicularly from a top of the base 12. The fins 14 extend from a first end to a second end of the base 12 opposite to the first end. A channel 16 is defined between every two adjacent fins 14. Two round fixing blind holes 122 and 124 are defined in the base 12, and are respectively arranged adjacent to the opposite first and second ends of the base 12 and in two different channels 16. In other embodiments, the shape of the blind holes 122 and 124 can be changed to other shapes, such as rectangular or triangular.

The circuit board 20 includes a heat-generating component 30, and two fixing elements 23 and 25.

The fixing element 23 includes a fixing portion 231 fixed on the circuit board 20, a substantially n-shaped locking portion 234, and an elastic connection portion 232 substantially perpendicularly extending from a first distal end of the locking portion 234 to be connected to the fixing portion 231. A distance between a second distal end of the locking portion 234 and the circuit board 20 is less than the sum of the thickness of the base 12 plus the thickness of the heat-generating component 30. The fixing element 25 has the same configuration as the fixing element 23, and includes a fixing portion 251, a substantially n-shaped locking portion 254, and an elastic connection portion 252. A distance between the locking portion 254 and the circuit board 20 is less than the thickness of the base 12 plus the thickness of the heat-generating component 30.

Figure 3:
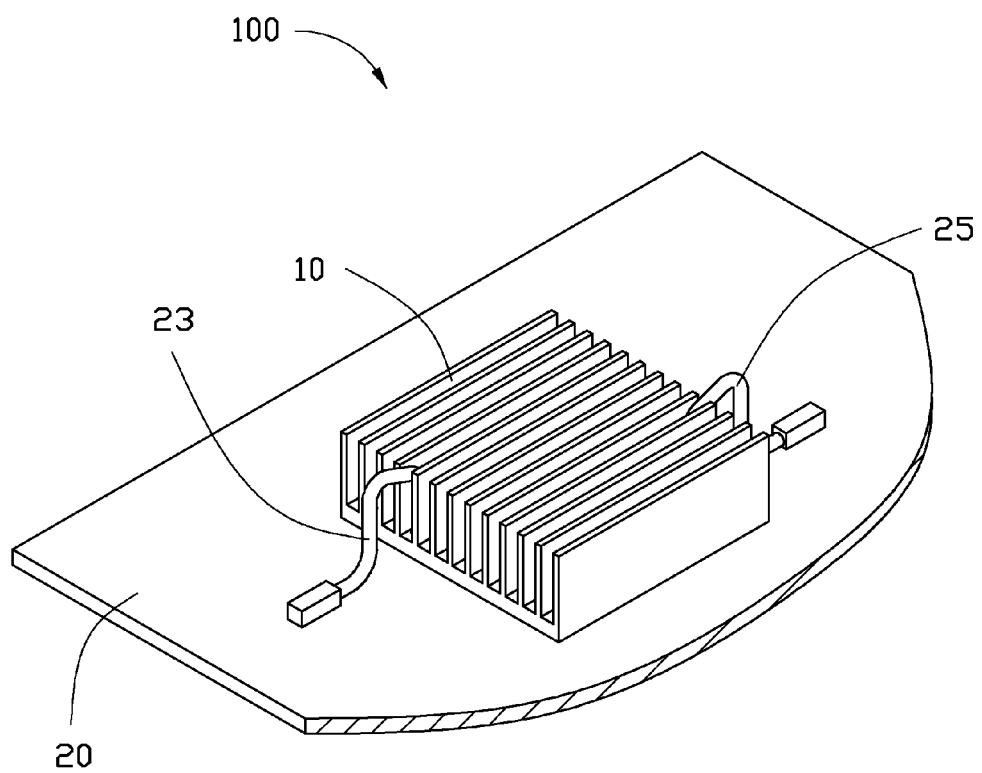
FIG. 3 is an assembled, isometric view of the printed circuit board of FIG. 1.

Referring to FIG. 3, in assembly, the connection portions 232 and 252 are deformed upwards to cause the locking portions 234 and 254 to move up, thereby allowing the heat sink 10 to be put on the heat-generating component 30. The connection portions 232 and 252 are released, causing the locking portions 234 and 254 to move back, thereby the second distal ends of the locking portions 234 and 254 are inserted into the corresponding blind holes 122 and 124 of the heat sink 10. Therefore, the heat sink 10 is fixed on the heat-generating component 30 through the fixing elements 23 and 25. The fixing elements 23 and 25 do not need to extend through the channels 16 of the heat sink 10, which can increase heat dissipation effect.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board comprising:
   a heat sink defining two fixing blind holes respectively arranged adjacent to opposite ends of the heat sink; and
   a circuit board comprising a heat-generating component and two fixing elements corresponding to the fixing blind holes, each of the fixing elements comprising:
   a fixing portion fixed on the circuit board;
   a locking portion comprising a first end, and a second end apart from and facing the circuit board; and
   an elastic connection portion extending from the first end of the locking portion to be connected to the fixing portion;
   wherein the second ends of the locking portions of the fixing elements are respectively inserted into the fixing blind holes of the heat sink, to fix the heat sink on the heat-generating component.

2. The printed circuit board of claim 1, wherein the heat sink comprises a rectangular thermal-conductive base and a plurality of thermal-conductive fins protruding substantially perpendicularly from a top of the base, the plurality of fins extend from a first end of the base and to a second end of the base opposite to the first end, a channel is bounded by every two adjacent fins, the fixing blind holes are arranged both in one channel or in two different channels.

3. The printed circuit board of claim 1, wherein the fixing blind holes are round.

4. The printed circuit board of claim 1, wherein the locking portions are substantially n-shaped.

5. A fixing element to fix a heat sink to a circuit board, the fixing element comprising:
   a fixing portion to be fixed on the circuit board;
   a locking portion comprising a first end and a second end; and
   an elastic connection portion extending from the first end of the locking portion to be connected to the fixing portion;
   wherein the connection portion is operable to be deformed to move the second end of the locking portion up, thereby allowing the heat sink to be located on the circuit board and under the second end of the locking portion, the second end of the locking portion resists against the heat sink to press the heat sink toward the circuit board after the connection portion is restored, wherein the locking portion is substantially n-shaped.

* * * * *